United States Patent [19]

Raets

[11] Patent Number: 4,700,083
[45] Date of Patent: Oct. 13, 1987

[54] RESONANT CIRCUIT ARRANGEMENT FOR SWITCHING THE CURRENT IN AN INDUCTIVE LOAD

[75] Inventor: Hubert C. Raets, Nieuwenhagen, Netherlands

[73] Assignee: U.S. Philips Corporation, New York, N.Y.

[21] Appl. No.: 756,402

[22] Filed: Jul. 18, 1985

[30] Foreign Application Priority Data

Jul. 26, 1984 [DE] Fed. Rep. of Germany ....... 3427492

[51] Int. Cl.$^4$ .......................... H03K 3/26; H03K 5/08; H02H 1/01
[52] U.S. Cl. .................................. 307/253; 307/540; 361/91; 361/113
[58] Field of Search .............. 307/270, 540, 412, 253; 328/170, 542; 361/155, 156, 82, 89, 90, 91, 56, 113

[56] References Cited

U.S. PATENT DOCUMENTS 2,332,811 10/1943 Rankin et al. ...................... 328/170
2,557,634 8/1971 Flaig .................................... 307/270

Primary Examiner—Stanley D. Miller
Assistant Examiner—B. P. Davis
Attorney, Agent, or Firm—Robert T. Mayer; Bernard Franzblau

[57] ABSTRACT

A circuit for switching current in an inductive load comprising at least one semiconductor switch which periodically switches the current through the load by means of its main current path which is switched alternately to the conductive and to the non-conductive state. A voltage-limiting element for limiting the voltage occuring at it is connected parallel to this main current path. Voltage peaks occuring in the non-conductive state across the main current path are reduced in that the voltage-limiting element (10,11) has a resonance having an oscillation period which is at most approximately ⅔ of the time interval (tn) in which the main current path is non-conducting.

15 Claims, 3 Drawing Figures

RESONANT CIRCUIT ARRANGEMENT FOR SWITCHING THE CURRENT IN AN INDUCTIVE LOAD

BACKGROUND OF THE INVENTION

This invention relates to a circuit arrangement for switching a current through a load which comprises an inductive dummy resistor, in which at least one semiconductor switch switches the current through the load periodically by means of its main current path which is switched alternately to the conductive and the non-conductive state, which has connected parallel to it a voltage-limiting element for limiting the voltage applied to it.

Such a circuit arrangement is known from the article "Class E—A New Class of High Efficiency Tuned Single-Ended Switching Power Amplifiers" by Sokal and Sokal, I.E.E.E. Journal of Solid State Circuits, Volume SC-10, No. 3, June 1975, p. 168-176. More particularly on page 172 of this article in FIG. 3 with associated text on page 172, lefthand column, a circuit arrangement is described having a switching transistor as the semiconductor switch. The emitter of the switching transistor is connected to ground potential and its collector is connected via a choke coil to the positive terminal of a direct voltage source. A first capacitance serving as a voltage-limiting element and a series arrangement of a second capacitance, a further coil and a load resistor are connected parallel to the collector-emitter path of the transistor (constituting the transistor main current path). The transistor is connected through its base connection to a driver, by means of which it is switched periodically to the conductive and to the non-conductive state. More particularly when the transistor is switched to the non-conductive state, the voltage which occurs at its collector-emitter path is kept low by the first capacitance in the time interval during which the transistor is switched from the conductive state to the non-conductive state until the current in the collector of the transistor has fully decayed to zero. The first capacitance is moreover defined so that the voltage across the collector-emitter path has again fallen to zero when the transistor is switched for the next time from the non-conductive to the conductive state. Thus, losses in the transistor are avoided and consequently the efficiency of the circuit arrangement is increased. Moreover, a direct voltage source of a higher voltage can now be used than would be possible in a circuit arrangement that did not include the first capacitance.

Depending upon the inductive load and the choke coil, the first capacitance is charged during the time interval in which the transistor is in the non-conductive state, while voltage peaks occur across the collector-emitter path. These voltage peaks have a height equal to a multiple of the voltage of the direct voltage source. The voltage peaks may lead to a voltage breakdown of the collector-emitter path even after it has been switched to the non-conductive state, as a result of which not only do losses occur again in the transistor, but this transistor can also be destroyed.

SUMMARY OF THE INVENTION

An object of the invention is to provide a circuit arrangement of the kind mentioned in the opening paragraph which is improved in such a manner that the voltage peaks at the main current path of the semiconductor switch are reduced and thus the risk of breakdown is avoided.

According to the invention, this object is achieved in that the voltage-limiting element has a resonance having an oscillation period which is at most approximately ⅔ of the time interval in which the main current path is non-donducting.

In the circuit arrangement according to the invention, after the semiconductor switch has been changed over to the non-conductive state, a periodical voltage is produced at the voltage-limiting element, whose oscillation frequency is equal to the resonance frequency of the voltage-limiting element. This periodical voltage is superimposed on the voltage peak occuring at the non-conducting main current path. The invention is based on the discovery that by the choice of the oscillation period of the periodical voltage, this voltage can be superimposed on the voltage peak in such a manner that the amplitude of the voltage peak can be reduced by a simultaneously occuring semi-oscillation of opposite sign in the periodic voltage.

Otherwise, the voltage-limiting element is advantageously proportioned so that it operates for the circuit arrangement in operation at the frequency at which the transistor switches periodically the current in the load as the known voltage-limiting element. This means, for example, that the voltage-limiting element constructed in accordance with the invention has, at the frequency at which the transistor switches the current through the load, the same impedance as the voltage-limiting element according to the prior art, so, for example, as the first capacitance used therein. With such a proportioning of the voltage-limiting element constructed in accordance with the invention, no change of the remaining elements of the circuit arrangement for adaptation to the voltage-limiting element is requied. The invention affords the advantage that the reverse voltages the semiconductor switch must be capable of withstanding are lower, as a result of which it is possible to use in a circuit arrangement for a given application a less voltage-resistant and thus less expensive semiconductor switch. Moreover, in the circuit arrangement constructed in accordance with the invention, the efficiency for the transmission of electrical energy from the direct voltage source to the load has increased in comparison with the circuit arrangements according to the prior art due to the changed variation as a function of time of the voltage across the main current path of the semiconductor switch in the non-conductive state.

In a further embodiment of the circuit arrangement according to the invention, in which the time intervals in a switching period of the semiconductor switch, in which the main current path is conducting and non-conducting, respectively, are at least substantially equal, the voltage-limiting element has its resonance at three times the switching frequency of the semiconductor switch. In this case, in which the duty cycle of the semiconductor switch is at least approximately 50%, a very favourable efficiency of the circuit arrangement is attained.

According to a further embodiment of the invention, the voltage-limiting element comprises a series resonant circuit. This series resonant circuit, which in the simplest case consists of a capacitor and a coil, forms at its resonance frequency a shortcircuit for the voltage across the main current path of the semiconductor switch. The coil and the capacitor of the series resonant circuit can be proportioned in a simple manner, for example, so that the impedance of the series resonant circuit at the switching frequency of the semiconductor switch corresponds to the impedance of the (first) capacitance known from the prior art as a voltage-limiting element.

BRIEF DESCRIPTION OF THE DRAWING

In order that the invention may be more readily carried out, it will now be described more fully, by way of example, with reference to the accompanying drawing, in which.

DESCRIPTION OF THE PREFERRED EMBODIMENTS

Figure 1:
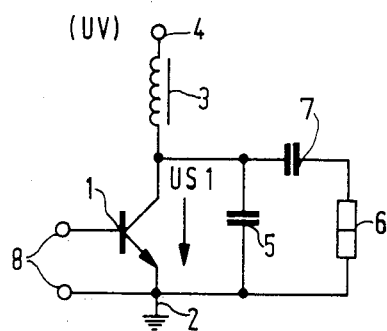
FIG. 1 shows a circuit arrangement according to the prior art.

FIG. 1 shows a circuit arrangement according to the prior art. A semiconductor switch 1 in the form of a transistor is connected through its emitter to a ground connection 2 and through its collector via a choke coil 3 to the positive terminal 4 of a direct voltage source. A first capacitor 5 serving as a voltage-limiting element and a load 6 comprising an inductive dummy resistor are connected parallel to the main current path of the semiconductor switch 1, which in the present case is constituted by the collector-emitter path of the transistor. A second capacitance 7 is connected in series with the load 6 (comprising a discharge lamp) and prevents a direct current shortcircuit between the positive terminal 4 of the direct voltage source and the ground connection 2 and is defined so that as a part of the network it also provides a contribution to the shaping of the desired waveforms of current and voltage at the switch.

The circuit arrangement has supplied to it via input terminals 8 a switching signal, by means of which the semiconductor switch 1 in the form of a transistor is switched periodically through its base connection alternately to the conductive and to the non-conductive state. In the conductive state, a current flows from the positive terminal 4 of the direct voltage source through the choke coil 3 and the main current path of the semiconductor switch 1 to the ground connection 2. After changeover of the semiconductor switch to the non-conductive state, a current produced by recharging the energy (from the dummy resistor of the load 6 to the capacitance 7 and from this capacitance back again to the dummy resistor) flows through the capacitance 5 first in the direction of the ground connection 2 and then in the opposite direction. Across the main current path of the semiconductor switch 1, a voltage US1 is built up, whose variation as a function of time t is represented in the time interval tn, in which the main current path is non-conducting, by the full line in FIG. 3. Consequently, across the main current path of the semiconductor switch 1 a voltage peak is produced whose amplitude corresponds, for example, in a practical embodiment of the circuit arrangement shown in FIG. 1, to 3.6 times that of the voltage UV supplied by the direct voltage source at its positive terminal 4.

Figure 2:
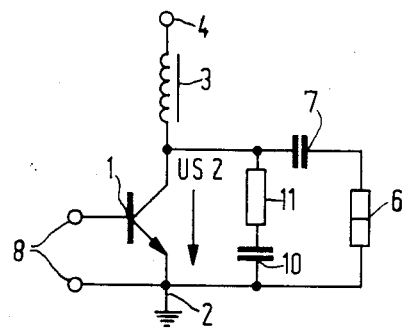
FIG. 2 shows an embodiment of the invention.

FIG. 2 shows an embodiment of a circuit arrangement according to the invention. Parts of the circuit arrangement shown in FIG. 2 which correspond to those in FIG. 1 are designated by like reference symbols and are described in the same way as in FIG. 1. The first capacitance 5 used in FIG. 1 as the voltage-limiting element is replaced in the circuit arrangement of FIG. 2 by a series resonant circuit comprising a resonant circuit capacitance 10 and a resonant circuit inductance 11. The series resonant circuit 10, 11 is proportioned so that it has a resonance having a period duration which corresponds to $\frac{2}{3}$ of the time interval tn, i.e. $\frac{2}{3}$ of the time interval in which the main current path of the semiconductor switch 1 is non-conducting. The resonant circuit capacitance 10 and the resonant circuit inductance 11 are further preferably chosen so that the impedance of the series resonant circuit at the frequency of the switching signal supplied through the input terminals 8 is just equal to the impedance of the first capacitance 5 in FIG. 1 at this frequency. All of the remaining parts of the circuit arrangement shown in FIG. 2 are then proportioned in the same way as the corresponding parts of the circuit arrangement shown in FIG. 1.

Figure 3:
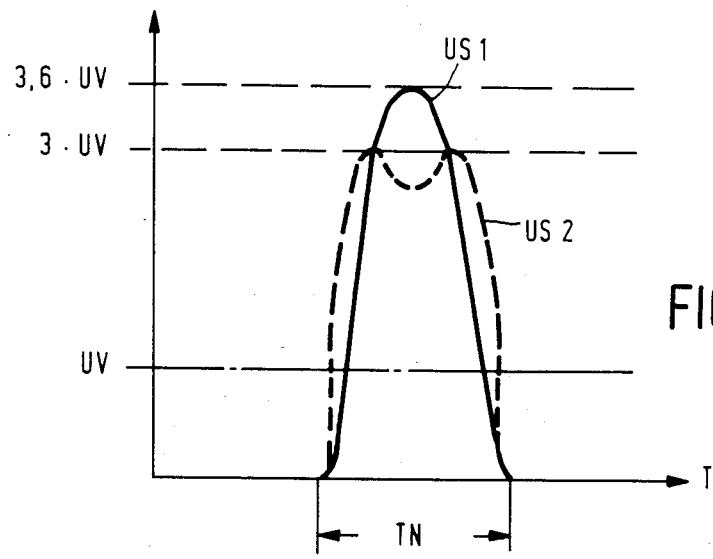
FIG. 3 shows the variations as a function of time of the voltages across the semiconductor switches in the circuit arrangements shown in FIGS. 1 and 2.

In FIG. 3, the variation as a function of time of the voltage US2 across the main current path of the semiconductor switch 1 during the time interval tn, in which the semiconductor switch 1 is in the non-conductive state, is indicated by a broken line. Now a voltage of three semi-oscillations is superimposed on the voltage peak US1 occuring in the circuit arrangement shown in FIG. 1, as a result of which as a whole a voltage variation of lower amplitude is obtained. In the above example, the latter value is equal to three times the voltage UV supplied by the direct voltage source at its positive terminal.

In the embodiments described above, a bipolar transistor of the npn type has been used as semiconductor switch. Of course semiconductor switches of other constructions, for example bipolar transistors of the pnp type, field effect transistors, so-called BIMOS transistors, thyristors and the like, may alternatively be used instead.

What is claimed is:

1. A circuit arrangement for switching a current through a load which includes an inductive component and a resistive component, comprising: at least one semiconductor switch that switches a current through the load periodically by means of its main current path which is switched alternately to a conductive and a non-conductive state, means for applying an operating voltage to the semiconductor switch, a voltage-limiting element connected in parallel with the main current path of said semiconductor switch for limiting the voltage applied to the semiconductor switch, characterized in that the voltage-limiting element has a resonance characteristic having an oscillation period which is at most approximately $\frac{2}{3}$ of the time interval in which the main current path is non-conducting.

2. A circuit arrangement as claimed in claim 1, wherein the time intervals in a switching period of the semiconductor switch in which the main current path is conducting or non-conducting are at least substantially equal, characterized in that the voltage-limiting element has its resonance at a value equal to three times the switching frequency of the semiconductor switch.

3. A circuit arrangement as claimed in claim 2, characterized in that the voltage-limiting element comprises a series resonant circuit.

4. A circuit arrangement as claimed in claim 1, characterized in that the voltage-limiting element comprises a series resonant circuit.

5. A circuit for switching current in a load having an inductive impedance component comprising: a pair of supply voltage terminals, at least one semiconductor switching device coupled to said supply voltage terminals and to the load so as to periodically switch a current through the load at a switching frequency, means for applying a switching signal at the switching frequency to a control electrode of the semiconductor switching device so as to alternately drive the semiconductor switching device into conduction and cut-off, and voltage-limiting means connected in parallel with the semiconductor switching device for limiting the voltage applied to said switching device, wherein the voltage-limiting means comprise a resonant LC network having an oscillation period approximately $\frac{2}{3}$ of the cut-off time interval of the semiconductor switching device.

6. A circuit as claimed in claim 5 wherein the switching signal applying means drives the semiconductor switching device at a duty cycle of approximately 50% and said LC network has a resonant frequency about three times the switching frequency of the semiconductor switching device.

7. A circuit as claimed in claim 5 wherein the LC network comprises an inductor (L) and a capacitor (C) connected in series to form a series resonant circuit.

8. A circuit as claimed in claim 7 further comprising a second inductor connected in series with the switching device across the supply voltage terminals and a second capacitor coupling the load in parallel with the semiconductor switching device.

9. A circuit as claimed in claim 8 wherein the second capacitor is connected between one terminal of the load and a junction point between the second inductor and the semiconductor switching device.

10. A circuit as claimed in claim 5 wherein the semiconductor switching device and the load are connected in parallel to said supply voltage terminals.

11. A circuit as claimed in claim 5 wherein said voltage-limiting means are arranged to be free of magnetic feedback from the load.

12. A circuit as claimed in claim 5 wherein the semiconductor switching device comprises a bipolar transistor and the load includes an electric discharge lamp, and the LC network comprises an inductor and a capacitor connected in series to form a series resonant circuit, said circuit further comprising a second capacitor coupling the load in parallel with the transistor to said supply voltage terminals.

13. A circuit as claimed in claim 12 further comprising a second inductor connected in series circuit with the transistor across the supply voltage terminals.

14. A circuit as claimed in claim 5 wherein the load includes an electrical discharge lamp, and the LC network and the load are each connected in parallel with the semiconductor switching device.

15. A circuit as claimed in claim 14 further comprising an inductor connected in series circuit with the semiconductor switching device across the supply voltage terminals, and said LC network comprises a series resonant LC circuit.

* * * * *